United States Patent [19]

Wiblin et al.

[11] Patent Number: 4,567,467

[45] Date of Patent: Jan. 28, 1986

[54] ANGULAR ROTARY POSITION ENCODER

[75] Inventors: Wayne T. Wiblin, Ashtabula; Grant C. Melocik, Chardon; Edward V. Leskovec, Eastlake; William Pickering, University Heights, all of Ohio

[73] Assignee: Towmotor Corporation, Mentor, Ohio

[21] Appl. No.: 582,113

[22] Filed: Feb. 21, 1984

[51] Int. Cl.⁴ ............................................. H03K 13/18
[52] U.S. Cl. ........................... 340/347 P; 250/231 SE; 340/347 M; 340/347 CC; 371/57
[58] Field of Search ........ 340/347 P, 347 M, 347 CC; 250/231 SE; 371/57

[56] References Cited

U.S. PATENT DOCUMENTS

| | | | |
|---|---|---|---|
| 3,484,780 | 12/1979 | Kamoi et al. | 340/347 |
| 3,939,938 | 2/1976 | Inoue | 180/79.2 R |
| 3,975,633 | 8/1976 | Larkin | 250/237 R |
| 4,064,504 | 12/1977 | Lepetit et al. | 340/347 P |
| 4,078,485 | 3/1978 | Guthrie | 101/93.21 |
| 4,190,767 | 2/1980 | Crouse | 250/231 SE |

Primary Examiner—T. J. Sloyan
Attorney, Agent, or Firm—Stephen L. Noe

[57] ABSTRACT

Information related to the rotary angular position of a steerable wheel portion of an electric vehicle is required for proper control of the vehicle and especially for differential control of the driven wheels of the vehicle. Available rotary position encoders are expensive, prone to damage in an industrial environment, and sensitive to misalignment between the encoder components. The instant apparatus provides a simple and durable rotary position encoder having a plurality of sensors positioned on a first mounting member and a plurality of sensible members positioned on a second mounting member. The apparatus is digital in design and the particular location and arrangement of the sensors and sensible members advantageously compensates for overtravel and misalignment of the encoder components.

14 Claims, 5 Drawing Figures

ANGULAR ROTARY POSITION ENCODER

1. Technical Field

This invention relates generally to an apparatus for encoding the position of a member relative to a reference position and, more particularly, to an apparatus for sensing the relative angular rotary position of a steerable vehicle wheel rotatable about an axis and producing a digital signal in response to the sensed position.

2. Background Art

Certain classes of vehicles are known to require information concerning the relative position of a steerable wheel of the vehicle relative to a reference point or plane in order to properly control the vehicle. For example, industrial electric vehicles or lift trucks of the three wheel variety commonly have a pair of independently driven traction wheels mounted opposite one another on the vehicle and a steerable wheel controllably rotatable about an axis in response to movement of a steering wheel. Owing to the need for differential action between the traction wheels during cornering maneuvers, information regarding the relative position of the steerable wheel relative to a straight ahead position is required. This information is utilized to determine the degree of differential action needed to complete the maneuver without skidding the traction wheels. The differential action varies from both traction wheels rotating in the same direction at the same speed to counter rotation of the traction wheels during very sharp cornering maneuvers.

Rotary position encoders are available commercially. One typical style of rotary encoder utilizes an optical system to read index marks carried on a printed or etched film. Such encoders are capable of providing high accuracy and excellent resolution, but are expensive and prone to damage in an industrial environment. Furthermore, such precision encoders require special assembly and maintenance techniques to insure proper alignment between the encoder components. The differential control of an industrial vehicle, on the other hand, requires only moderate accuracy and resolution of the position of the steerable wheel, but demands an encoder that is durable in an industrial environment and that is tolerant of moderate misalignment owing to assembly or ordinary wear and tear.

A second known type of rotary angular encoder for vehicles typically utilizes a potentiometer device. The shaft of a potentiometer is driven by rotation of the steerable wheel about an axis and an analog voltage signal is taken from the wiper element of the potentiometer. Potentiometers are prone to wear along the contact surface and are generally unreliable in an industrial environment. Furthermore, the analog output of a potentiometer is not readily used by a modern digital vehicle controller and must be converted from the analog to the digital domain. Likewise, rotary optical encoders of the type described above, in addition to the deficiencies already enumerated, often produce either an analog signal or a pulse type signal, neither of which is suitable for unmodified use by a digital controller.

Also, of those commercially available rotary encoders that do produce a digital output signal, most are designed to operate through a 360 degree range, normally necessitating an additional sensor pathway for each bit of resolution desired. Owing to the fact that the steerable wheel of a vehicle need not rotate more than 90 degrees either side of a straight ahead position for complete steering flexibility, a suitable encoder need operate through only a 180 degree range, allowing a single sensor pathway to provide two bits of position information. However, overtravel or slight misalignment between the various components of an encoder having two sensors per sensor pathway causes misinformation to be provided unless provision is made to obviate such effects.

The present invention is directed to overcoming one or more of the problems as set forth above.

DISCLOSURE OF THE INVENTION

In one aspect of the present invention an apparatus is provided for encoding the position of a steerable wheel portion of a vehicle relative to a non-steerable portion of the vehicle, where the steerable portion is rotatable about an axis. The apparatus has a first mounting member connected to the non-steerable portion of the vehicle and includes a planar surface having first and second sensor pathways. A plurality of sensors are positioned along the first and second sensor pathways. The apparatus also has a second mounting member having third and fourth sensor pathways on a different planar surface. The second member is connected to the steerable wheel portion of the vehicle with the planar surfaces parallel to and facing one another, and has a plurality of sensible members positioned along the third and fourth sensor pathways.

The apparatus facilitates obtaining multiple position signals from each sensor pathway while advantageously allowing for overtravel and misalignment of components, is digital in design, and is of simple, rugged, and inexpensive construction.

BRIEF DESCRIPTION OF THE DRAWINGS

For a better understanding of the present invention, reference may be made to the accompanying drawings, in which.

BEST MODE FOR CARRING OUT THE INVENTION

Figure 1:
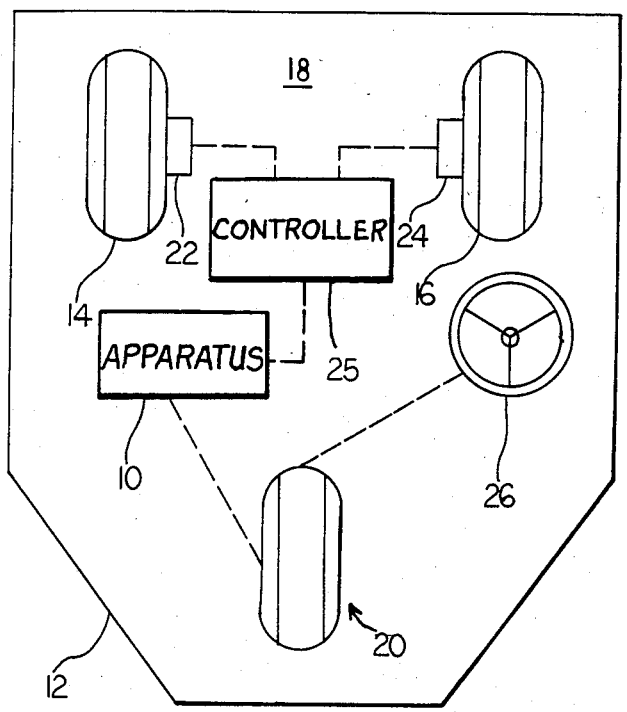
FIG. 1 is a schematic view of a vehicle including the present invention.

Referring first to FIG. 1, an apparatus embodying certain of the principles of the present invention is generally indicated by the reference numeral 10. It should be understood that the following detailed description relates to the best presently known embodiment of the apparatus 10. However, the apparatus 10 can assume numerous other embodiments, as will become apparent to those skilled in the art, without departing from the appended claims.

The apparatus 10 is shown in conjunction with a vehicle 12, for example, an industrial vehicle such as a lift truck. The vehicle 12 includes left and right traction wheels 14,16 attached to a non-steerable portion 18 of the vehicle 12, and a steerable wheel portion 20. The traction wheels 14,16 are independently driven by respective electric motors 22,24, the speed and direction of rotation being controlled by a vehicle controller 25.

The steerable wheel portion 20 is rotated for direction control by an associated steering control or wheel 26. In response to movement of the steering wheel 26, the steerable wheel portion 20 is rotated from a central or straight ahead position either left or right about an axis 28, controlling the direction of travel of the vehicle 12.

Figure 2:
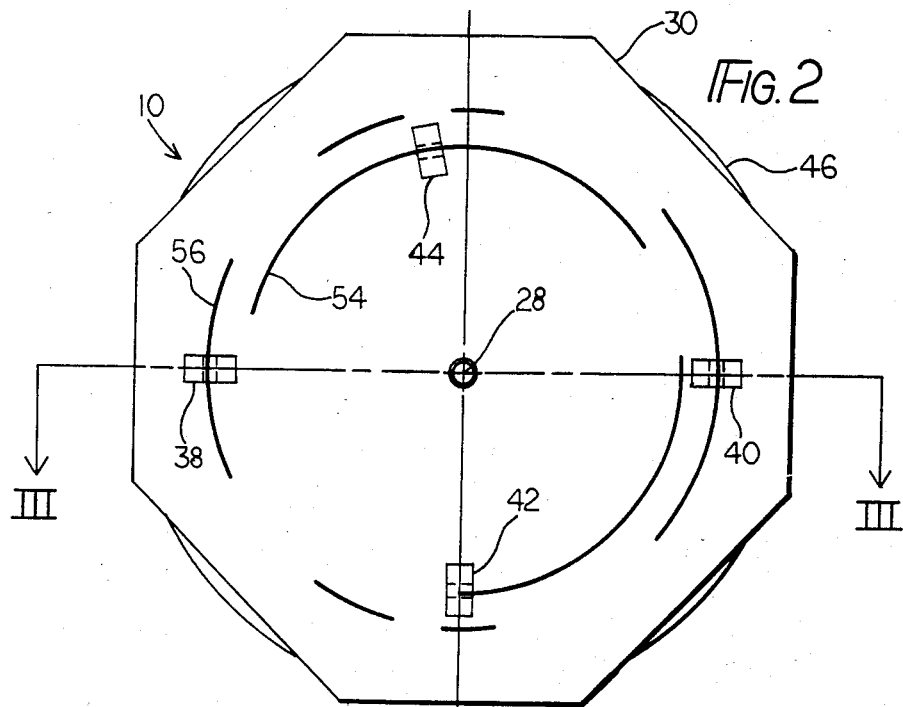
FIG. 2 is a schematized top view of an embodiment of the present invention.
Figure 3:
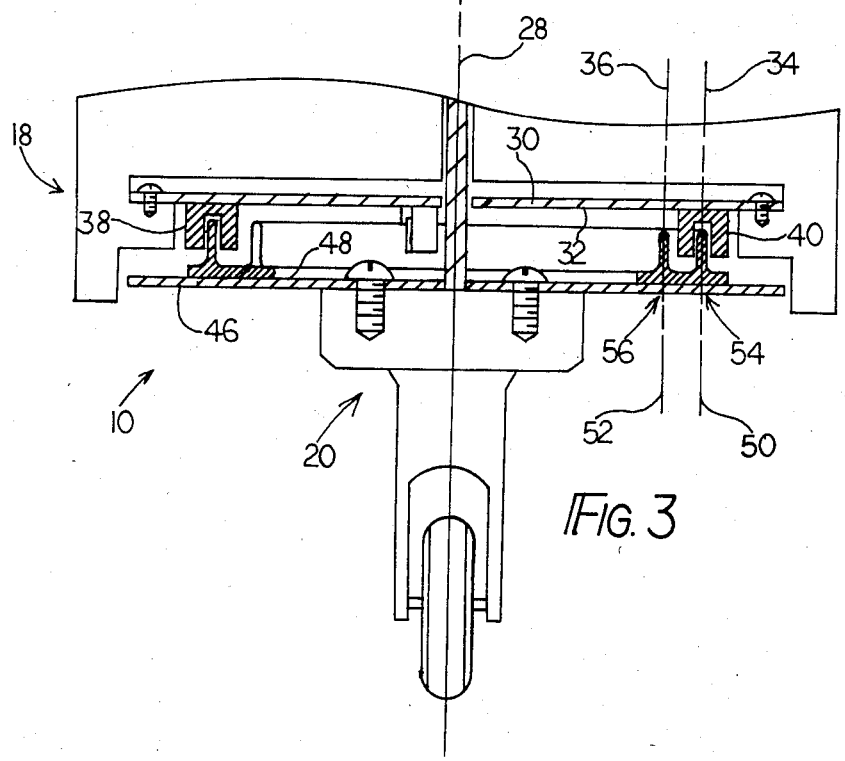
FIG. 3 is a partially sectioned edge view of the embodiment of FIG. 2.

FIGS. 2 and 3 show the axis 28 associated with an embodiment of the apparatus 10. Included is a first mounting member 30 having a first planar surface 32 and first and second curvilinear sensor pathways 34,36. The first mounting member 30 is connected or attached to the non-steerable portion 18 of the vehicle 12, with the first planar surface 32 substantially perpendicular to and extending about the axis 28. The first and second sensor pathways 34,36 are curvilinear mounting locations on the first planar surface 32 and are concentrically positioned about the axis 28.

First and second sensors 38,40 are positioned diametrically opposite one another along one of the first and second curvilinear sensor pathways 34,36. Third and fourth sensors 42,44 are positioned other than diametrically opposite one another along the other of the first and second sensor pathways 34,36. Each of the sensors 38,40,42,44 includes a respective optical emitter and optical receiver coupled by an optical path. The sensors 38,40,42,44 are, for example, slotted optical switches such as model number OPB 804 manufactured by TRW Inc. of Carrollton, Tex. In the preferred embodiment, one of the third and fourth sensors 42,44 is angularly displaced along the sensor pathway 34,36 by a predetermined amount, for example 10 degrees, from a position diametrically opposite the other of the third and fourth sensors 42,44. The actual displacement can vary, and is preferably in the range of 5 to 15 degrees.

The apparatus 10 also includes a second mounting member 46 having a second planar surface 48 and third and fourth curvilinear sensor pathways 50,52. The second mounting member 46 is connected or attached to the steerable portion 20 of the vehicle 12 and is rotatable about the axis 28, with the second planar surface 48 being parallel to and facing the first planar surface 32. The third and fourth sensor pathways 50,52 are curvilinear mounting locations on the second planar surface 48 and are concentrically positioned about the axis 28.

First and second pluralities of sensible members 54,56 are respectively positioned along the third and fourth sensor pathways 50,52. In the preferred embodiment, the sensible members 54,56 are light blocking projections extending outward from the second planar surface 48 and are of a construction and at a location sufficient to controllably interrupt, or block and fail to block, the sensor optical paths in response to rotation of the second mounting member 48 relative to the first mounting member 32. Those skilled in the art will recognize that, although optical sensors and light blocking sensible members are used in the preferred embodiment, other sensing arrangements and constructions utilizing Hall effect devices, etc. can be readily incorporated in the apparatus 10.

The light blocking projections in the embodiment shown in FIGS. 2 and 3 are molded plastic fins spaced intermittently along the third and fourth sensor pathways 50,52. The particular construction and arrangement of the fins, as shown schematically in FIG. 2, forms a particular gray code pattern, as later discussed with reference to FIG. 5.

Figure 4:
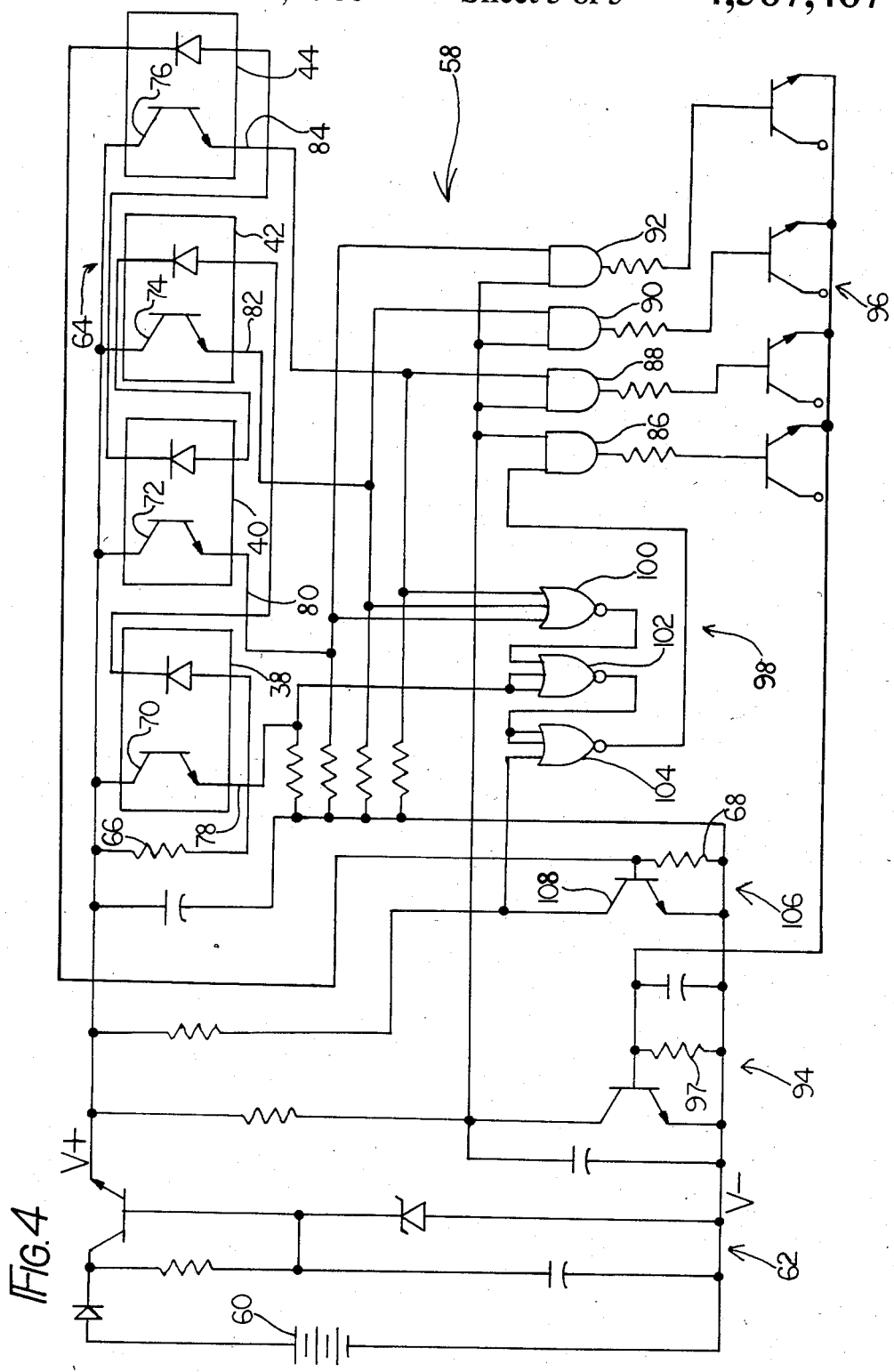
FIG. 4 is a schematic representation of an electric circuit used in the embodiment of FIG. 2; and, FIG. 5 is a graphic representation related to the operation of the embodiment of FIG. 2.

Referring now to FIG. 4, each of the sensors 38,40,42,44 is adapted to deliver a respective position signal in response to the relative position of the sensible members 54,56 and the respective sensor 38,40,42,44. The apparatus 10 includes electrical circuit means 58 for receiving the position signals from each of the sensors 38,40,42,44, combining the received signals, and forming one of a plurality of predetermined digital signals in response to the received signals.

In the preferred embodiment, power is supplied to the circuit means 58 from a battery 60 associated with the vehicle 12. Power can be supplied by another DC power source. A conventional voltage regulator 62 is connected to the battery 60 and delivers regulated DC power to respective positive and negative lines V+ and V− of the means 58.

The sensor emitters are, for example, a plurality of light emitting diodes 64 connected in a series arrangement with a current limiting resistor 66 and a current sensing resistor 68 between V+ and V+. The sensor receivers include, for example, a plurality of photo transistors 70,72,74,76 each having a collector connected to V+ and an emitter connected to a respective output line 78,80,82,84. The output lines 78,80,82,84 are connected through respective resistors to V+. A plurality of "AND" circuits 86,88,90,92 each has a first input connected to an output of a protection means 94 and an output connected to a respective one of a plurality of output transistors 96. Each of the output transistors 96 has an emitter connected in common through a current sensing resistor 97 to V−.

Electrical circuit means 58 also includes logic means 98 for controllably modifying one of the position signals in response to receiving a predetermined combination of position signals from the sensors 38,40, 42,44. Logic means 98 includes first, second and third logical "NOR" circuits 100,102,104, each having a plurality of inputs and an output.

Three of the sensor output lines 80,82,84 are connected to respective inputs of the first "NOR" circuit 100 and to respective second inputs of three of the "AND" circuits 88,90,92. The remaining sensor output line 78 is connected to an input of the second "NOR" circuit 102 and the remaining input of the second "NOR" circuit 102 is connected to the output of the first "NOR" circuit 100. The output of the second "NOR" circuit 102 is connected to an input of the third "NOR" circuit 104, with the output of the third "NOR" circuit 104 connected to the second input of the remaining "AND" circuit 86.

A last input of the third "NOR" circuit 104 is connected to a failsafe means 106 for blocking the modified one of the position signals and causing a predetermined one of the digital signals to be delivered in response to a failure of one of the sensors 38,40, 42,44. The means 106 includes a transistor 108 having an output connected to the input of the third "NOR" circuit 104 and an input connected to the current sensing resistor 68.

The ratings and values shown for various electrical elements discussed above are for exemplary purposes only. Alterations of the circuit and embodiment discussed and the use of electrical elements of different constructions or ratings will be readily apparent to those skilled in the art. Such alterations or substitutions can be implemented without departing from the appended claims.

INDUSTRIAL APPLICABILITY

Figure 5:
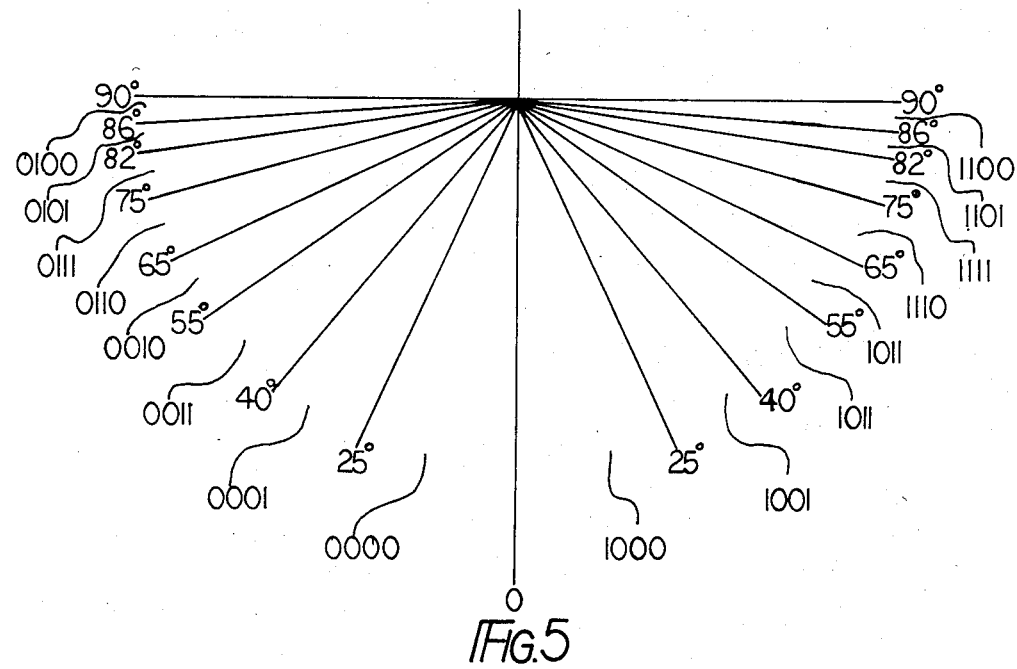

Operation of the apparatus 10 is best described in relation to its use on the three wheeled electric vehicle 12. In response to a steering command from the steering wheel 26, the steerable wheel portion 20 is rotated about the axis 28 to one of a multiplicity of angular positions displaced left and right of a central or straight ahead position, as is best shown in FIG. 5. To successfully negotiate a turn, the driven wheels 14,16 preferably operate in a differential manner, the required amount of differential action being determined by the angle of the steerable wheel portion 20 relative to the central position.

Experience has shown that an infinite range of differential speeds is not required and that a plurality of discrete differential speed steps offers satisfactory cornering ability, for example, eight steps over a 0 to 90 degree steering angle. In addition, it is desirable that no differential action occur while an operator makes minor steering adjustments in a basically straight ahead course of travel of the vehicle 12, and that the differential action be non-linear and progressively greater as the steering angle approaches 90 degrees. The use of a plurality of discrete steps is also advantageous when provided in conjunction with a modern digital computer controlled vehicle owing to the need for discrete digital signals as controller inputs.

FIG. 5 depicts the center or straight ahead position of the steerable wheel portion 20 of the vehicle 12 as the 0 degree line and shows 8 non-linear angular divisions on either side of the straight ahead position. Within each angular division is the corresponding 4 bit gray coded digital signal delivered by the means 58 from respective "AND" circuits 86,88,90,92. Each of these discrete digital signals represents a different required differential wheel speed that the vehicle controller 25 provides via the motors 22,24 attached to the driven wheels 14,16. The speed control is, for example, accomplished by conventional means utilizing choppers to control the mean current flowing through the motors 22,24.

Sensing the steerable wheel portion 20 position is accomplished by the apparatus 10. Adverting to FIG. 2, the light blocking projections of the pluralities of sensible members 54,56 rotate about the axis 28 in response to rotation of the steerable wheel portion 20. Again referring to FIG. 4, in response to the presence of a projection intermediate the optical emitter and receiver of one of the sensors 38,40,42,44, the respective optical path is blocked, the respective transistor 70,72,74,76 turns off, and the respective line 78,80,82,84 approaches the V-voltage or logic "0" level. Conversely, in response to the absence of a projection within the optical path, the respective transistor 70,72,74,76 turns "ON" and the respective line 78,80,82,84 approaches the V+ voltage or logic "1" level.

In steering the vehicle 12, the steerable wheel portion need never rotate beyond 90 degrees from the center position; therefore, it is theoretically possible to obtain 4 bits of position control information from two rotary pathways of an encoding device by simply placing two sensors diagonally opposite one another on each pathway. However, mechanical overtravel of the sensible members 54,56 relative to the sensors 38,40, 42,44, hysteresis, and misalignment during assembly make such an encoder impractical. Offsetting one sensor by, for example, 10 degrees from the position diagonally opposite an opposing sensor, and shifting the position of the sensible members 54,56 of the respective pathway by one half of the offset amount or, for example, 5 degrees, provides a plus or minus 5 degree tolerance band and makes such an arrangement practical. Such shifted configuration is clearly shown in FIG. 2.

The position signals from the sensors 38,40, 42,44 are delivered by the lines 78,80,82,84 to the logic means 98 and to the "AND" circuits 86,88,90,92 where they are logically controlled to form respective digital signals. The digital signals output by the "AND" circuits 86,88,90,92 are delivered to respective output transistors 96. The output transistors 96 invert the digital signals prior to delivering them to the vehicle controller 25. Such inversion of logic signals is common in the art and is not considered in the following discussion, in which the logic signals are referred to as delivered from the "AND" circuits 86,88,90,92.

The position signal from one of the sensors 42 indicates the left and right direction of rotation of the steerable wheel portion 20 of the vehicle 12 from the central position, owing to the arrangement of the sensible members 54,56 associated with the one sensor 42. This position signal is available for use in systems requiring it; however, in the preferred embodiment, no differential action is desired about the central position.

Of course, the digital signals "0000" and "1000" associated with the central position can simply be ignored by the vehicle controller 25. Preferably, the apparatus 10 employs these two digital signals for error checking purposes. The logic means 98 receives each of the position signals from the sensors 38,40,42,44 and modifies the one position signal from the sensor 42 in response to the one signal being logic "0" concurrent with each of the other signals being logic "0". Therefore, in response to the steerable wheel portion 20 being positioned at the first angular step either side of the central position, as shown in FIG. 5, the digital signal delivered by the "AND" circuits 86,88,90,92 is "1000".

Most known failure modes of the apparatus 10 cause the digital signal delivered to be "0000", for example, loss of power to the circuit means 58 and a broken wire connecting the apparatus 10 to the controller 25. Owing to the fact that the digital signal "0000" is never produced as a valid signal by the apparatus 10, the vehicle controller 25 interprets it as an error signal and takes appropriate action, for example, stopping the vehicle 12, or signaling the operator. In response to failure of one of the series connected diode optical emitters, the current sensed by the resistor 68 approaches zero, the transistor 108 shuts "OFF", and the logic means 98 is blocked from modifying the one position signal, causing the error signal "0000" to be produced.

As an additional protective measure, excessive current being drawn by any of the output transistors 96 is sensed by the resistor 97, and a blocking signal is delivered by the protection means 94 to each of the "AND" circuits 86,88,90,92, again causing the error signal "0000" to be delivered.

Other aspects, objects, advantages and uses of this invention can be obtained from a study of the drawings, the disclosure and the appended claims.

We claim:

1. Apparatus for encoding the position of a steerable wheel portion of a vehicle relative to a non-steerable portion of said vehicle, said steerable wheel portion being rotatable left and right of a central position about an axis, comprising:

a first mounting member having a first planar surface and first and second curvilinear sensor pathways, said first mounting member being connected to said non-steerable portion of said vehicle, said first planar surface being substantially perpendicular to said axis, and said first and second sensor pathways being concentrically positioned about said axis on said first planar surface;

first and second sensors positioned diametrically opposite one another along one of said first and second curvilinear sensor pathways;

third and fourth sensors positioned other than diametrically opposite one another along the other of said first and second curvilinear sensor pathways;

a second mounting member having a second planar surface and third and fourth curvilinear sensor pathways, said second mounting member being connected to said steerable wheel portion of said vehicle and rotatable about said axis, said second planar surface being substantially parallel to and facing said first planar surface, and said third and fourth sensor pathways being concentrically positioned about said axis on said second planar surface; and, first and second pluralities of sensible light blocking members extending outward from said second planar surface and being respectively positioned along said third and fourth sensor pathways.

2. Apparatus, as set forth in claim 1, wherein each of said sensors has a respective optical emitter and optical receiver coupled by an optical path and wherein said first and second pluralities of sensible members are light blocking projections extending outwardly from said second planar surface, said projections being of a construction and at a location sufficient to controllably block and fail to block predetermined ones of said optical paths in response to rotation of said second mounting member relative to said first mounting member.

3. Apparatus, as set forth in claim 2, wherein one of said third and fourth sensors is angularly displaced within a range from 5 to 15 degrees from a position diametrically opposite the other of said third and fourth sensors.

4. Apparatus, as set forth in claim 1, wherein one of said sensors delivers a respective direction signal in response to either the left and right direction of rotation of said steerable wheel portion from said central position.

5. Apparatus, as set forth in claim 1, wherein each of said sensors is adapted to deliver a position signal in response to the relative position of said sensible members and the respective sensor and including electrical circuit means for receiving said position signals from each of said sensors, combining said received signals, and delivering one of a plurality of predetermined digital signals in response to said received signals.

6. Apparatus, as set forth in claim 5, wherein said electrical circuit means includes a plurality of logical "AND" circuits having inputs and outputs, respective ones of said inputs being connected to each of said sensors.

7. Apparatus, as set forth in claim 5, wherein said electrical circuit means includes logic means for controllably modifying one of said position signals in response to receiving a predetermined combination of said position signals from said sensors.

8. Apparatus, as set forth in claim 7, wherein said logic means includes a plurality of logical "OR" circuits connected between one of said sensors and said "AND" circuits.

9. Apparatus, as set forth in claim 7, wherein said logic means includes failsafe means for blocking the modified one of said position signals in response to failure of one of said sensors.

10. Apparatus, as set forth in claim 5, wherein said electrical circuit means includes protection means for producing a predetermined one of said digital signals in response to a predetermined fault condition of said circuit means.

11. Apparatus, as set forth in claim 5, wherein said digital signals vary non-linearly in response to the angular degree of rotation of said steerable wheel portion about said axis from said central position.

12. Apparatus, as set forth in claim 11, wherein said digital signals are gray coded.

13. Apparatus for encoding the position of a steerable wheel portion of a vehicle relative to a non-steerable portion of said vehicle, said steerable wheel portion being rotatable left and right of a central position about an axis, comprising:

a first mounting member having a first planar surface and first and second curvilinear sensor pathways, said first mounting member being connected to said non-steerable portion of said vehicle, said first planar surface being substantially perpendicular to said axis, and said first and second sensor pathways being concentrically positioned about said axis on said first planar surface;

first and second sensors, each of said sensors having a respective optical emitter and optical receiver coupled by an optical path, said first and second sensors being positioned diametrically opposite one another along one of said first and second curvilinear sensor pathways;

third and fourth sensors, each of said sensors having a respective optical emitter and optical receiver coupled by an optical path, said third and fourth sensors being positioned other than diametrically opposite one another along the other of said first and second curvilinear sensor pathways;

a second mounting member having a second planar surface and third and fourth curvilinear sensor pathways, said second mounting member being connected to said steerable wheel portion of said vehicle and rotatable about said axis, said second planar surface being substantially parallel to and facing said first planar surface, and said third and fourth sensor pathways being concentrically positioned about said axis on said second planar surface; and, first and second pluralities of sensible light blocking members extending outward from said second planar surface and being respectively positioned along said third and fourth sensor pathways, said projections being of a construction and at a location sufficient to controllably interrupt predetermined ones of said optical paths in response to rotation of said second mounting member relative to said first mounting member.

14. Apparatus, as set forth in claim 13, wherein one of said third and fourth sensors is angularly displaced 10 degrees from a position diametrically opposite the other of said third and fourth sensors.

* * * * *

UNITED STATES PATENT AND TRADEMARK OFFICE
CERTIFICATE OF CORRECTION

PATENT NO. : 4,567,467
DATED : January 28, 1986
INVENTOR(S) : Wayne T. Wiblin, et al.

It is certified that error appears in the above-identified patent and that said Letters Patent is hereby corrected as shown below:

In the specification:

Column 4, line 18, " V+ " (second occurrence) should be -- V- --.

Column 4, line 23, " V+ " should be -- V- --.

Column 4, line 40, " 88,90,92 " should be -- 92,90,88 --.

Column 5, line 46, " 38,40,42,44 " should be -- 42,40,38,44 --.

Column 6, line 3, " 38,40,42,44 " should be -- 42,40,38,44 --.

Column 6, line 35, " 86,88,90,92 " should be -- 86,92,90,88 --.

In the Figures:

Under Figure 4, the sensor labeled "38" should be labeled --42--.

Under Figure 4, the sensor labeled "42" should be labeled --38--.

Under Figure 5, the output "1011" at $55^{o}$ should be --1010--.

Signed and Sealed this

Second Day of August, 1988

Attest:

DONALD J. QUIGG

Attesting Officer     Commissioner of Patents and Trademarks